(12) United States Patent
Zucca (10) Patent No.: US 11,658,543 B2
(45) Date of Patent: May 23, 2023

(54) IMPACT TOOL AND ELECTRIC MOTOR

(71) Applicant: MILWAUKEE ELECTRIC TOOL CORPORATION, Brookfield, WI (US)

(72) Inventor: Gerald A. Zucca, Milwaukee, WI (US)

(73) Assignee: MILWAUKEE ELECTRIC TOOL CORPORATION, Brookfield, WI (US)

( * ) Notice: Subject to any disclaimer, the term of this patent is extended or adjusted under 35 U.S.C. 154(b) by 37 days.

(21) Appl. No.: 17/224,517

(22) Filed: Apr. 7, 2021

(65) Prior Publication Data

US 2021/0315101 A1 Oct. 7, 2021

Related U.S. Application Data

(60) Provisional application No. 63/006,432, filed on Apr. 7, 2020.

(51) Int. Cl.
*H02K 11/30* (2016.01)
*H02K 11/33* (2016.01)
(Continued)

(52) U.S. Cl.
CPC ........... *H02K 5/225* (2013.01); *B25B 21/026* (2013.01); *H02K 1/165* (2013.01); *H02K 3/28* (2013.01);
(Continued)

(58) Field of Classification Search
CPC .......... H02K 7/14; H02K 7/145; H02K 1/185; H02K 1/165; H02K 3/28; H02K 11/33;
(Continued)

(56) References Cited

U.S. PATENT DOCUMENTS 3,681,738 A 8/1972 Friend
3,989,331 A 11/1976 Hanlon
(Continued)

FOREIGN PATENT DOCUMENTS

CN 109301539 A 2/2019
CN 106211628 B 5/2019
(Continued)

OTHER PUBLICATIONS

Ochmann Ernst, Vibration Resistance Ensuring Method For Cup Capacitor, Apr. 9, 2009, DE 102007045630 (English Machine Translation) (Year: 2009).*

(Continued)

*Primary Examiner* — Alexander A Singh
(74) *Attorney, Agent, or Firm* — Michael Best & Friedrich LLP (57) ABSTRACT

An electric motor includes a rotor assembly, a stator assembly, a printed circuit board, and a solder cup. The stator assembly includes a lamination stack defining teeth, coils supported about the teeth, and a conductive terminal electrically connected to at least one coil. The conductive terminal includes a lead portion. The printed circuit board is coupled to the stator assembly and includes opposed first and second sides, and a through hole extending through the printed circuit board and receiving the lead portion. The printed circuit board further includes a solder pad surrounding the through hole on at least one of the first side or the second side. The solder cup is supported on the lead portion between the printed circuit board and the stator assembly, and includes a wide end facing toward the printed circuit board, and a narrow end opposite the wide end.

20 Claims, 11 Drawing Sheets (51) Int. Cl.
*H02K 5/22* (2006.01)
*H05K 1/11* (2006.01)
*B25B 21/02* (2006.01)
*H02K 1/16* (2006.01)
*H05K 1/02* (2006.01)
*H02K 3/28* (2006.01)

(52) U.S. Cl.
CPC ........... *H02K 11/33* (2016.01); *H05K 1/0209* (2013.01); *H05K 1/113* (2013.01); *H02K 2211/03* (2013.01); *H05K 2201/1009* (2013.01)

(58) Field of Classification Search
CPC .... H02K 3/522; H02K 2211/03; H02K 11/30; H02K 5/225; H05K 3/32; H05K 3/306; H05K 3/34; H05K 3/3468; H05K 1/113; H05K 1/0209; H05K 3/3447; H05K 2201/1009; H05K 1/116; H05K 2201/10409; H05K 2201/09027; B25B 21/02; B25B 21/026
USPC .................................................. 310/71, 68 R
See application file for complete search history.

(56) References Cited

U.S. PATENT DOCUMENTS

| | | |
|---|---|---|
| 4,257,668 A | 3/1981 | Ellis, Jr. |
| 4,294,007 A | 10/1981 | Ellis, Jr. |
| 4,942,997 A | 7/1990 | Sinkunas et al. |
| 5,131,853 A | 7/1992 | Meyer |
| 5,184,767 A | 2/1993 | Estes |
| 5,290,970 A | 3/1994 | Currie |
| 5,352,125 A | 10/1994 | Banakis et al. |
| 5,653,601 A | 8/1997 | Martucci et al. |
| 6,011,693 A * | 1/2000 | Gore .................... H05K 3/3426 361/768 |
| 6,290,555 B1 | 9/2001 | Nubuyuki et al. |
| 2004/0209495 A1 | 10/2004 | Kennedy et al. |
| 2010/0085717 A1* | 4/2010 | Sweeney .............. H05K 3/3447 29/846 |
| 2016/0359392 A1 | 12/2016 | Mergener et al. |
| 2018/0262092 A1* | 9/2018 | Beyerl ................. H02K 11/215 |
| 2019/0044110 A1* | 2/2019 | Sheeks ................ H01M 50/233 |
| 2019/0386547 A1 | 12/2019 | Im et al. |

FOREIGN PATENT DOCUMENTS

| | | | |
|---|---|---|---|
| DE | 102007045630 A1 * | 4/2009 | ............... H01G 2/06 |
| EP | 166817 B1 | 1/1986 | |
| JP | 2008210673 A | 9/2008 | |
| JP | 2010050198 A | 3/2010 | |

OTHER PUBLICATIONS

International Search Report and Written Opinion for Application No. PCT/US2021/026156 dated Jul. 27, 2021 (9 pages).

* cited by examiner

FIG. 17

IMPACT TOOL AND ELECTRIC MOTOR

CROSS-REFERENCE TO RELATED APPLICATIONS

This application claims priority to U.S. Provisional Patent Application No. 63/006,432, filed Apr. 7, 2020, the entire content of which is hereby incorporated by reference.

FIELD OF THE INVENTION

The present invention relates to power tools, and more specifically to impact tools.

BACKGROUND OF THE INVENTION

Impact tools or wrenches are typically utilized to provide a striking rotational force, or intermittent applications of torque, to a tool element or workpiece (e.g., a fastener) to either tighten or loosen the fastener. As such, impact wrenches are typically used to loosen or remove stuck fasteners (e.g., an automobile lug nut on an axle stud) that are otherwise not removable or very difficult to remove using hand tools.

SUMMARY OF THE INVENTION

The present invention provides, in one aspect, an electric motor including a rotor assembly, a stator assembly, a printed circuit board, and a solder cup. The stator assembly includes a lamination stack defining a plurality of inwardly extending teeth, a plurality of coils supported about the plurality of teeth, and a conductive terminal electrically connected to at least one coil of the plurality of coils. The conductive terminal includes a lead portion. The printed circuit board is coupled to the stator assembly and includes opposed first and second sides. The printed circuit board also includes a through hole extending through the printed circuit board between the first and second sides and receiving the lead portion. The printed circuit board further includes a solder pad surrounding the through hole on at least one of the first side or the second side. The solder cup is supported on the lead portion between the printed circuit board and the stator assembly. The solder cup includes a wide end facing toward the printed circuit board, and a narrow end opposite the wide end.

The present invention provides, in another aspect, a power tool including a housing and an electric motor. The electric motor includes a rotor assembly and a stator assembly having a plurality of inwardly extending teeth, a plurality of coils supported about the teeth, and a conductive terminal electrically coupled to at least one coil of the plurality of coils, the conductive terminal including a lead portion. The electric motor also includes a printed circuit board coupled to the stator assembly, the printed circuit board including a through hole configured to receive the lead portion. The electric motor further includes a solder cup supported on the lead portion, the solder cup having a funnel shape and including a wide end facing toward the printed circuit board and configured to capture solder applied to the lead portion.

The present invention provides, in another aspect, a printed circuit board assembly soldered to a lead portion of a conductive terminal of an electric motor. The printed circuit board assembly includes a printed circuit board having opposed first and second sides and a through hole extending through the printed circuit board between the first and second sides. The through hole receives the lead portion. The printed circuit board also includes a first solder pad surrounding the through hole on the first side and a second solder pad surrounding the through hole on the second side. The printed circuit board assembly further includes a solder cup supported on the lead portion. The solder cup has a funnel shape and includes a wide end facing toward the printed circuit board, a narrow end opposite the wide end, and a center aperture extending between the wide end and the narrow end. The center aperture is configured to receive the lead portion.

Other features and aspects of the invention will become apparent by consideration of the following detailed description and accompanying drawings.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting.

DETAILED DESCRIPTION

Figure 1:
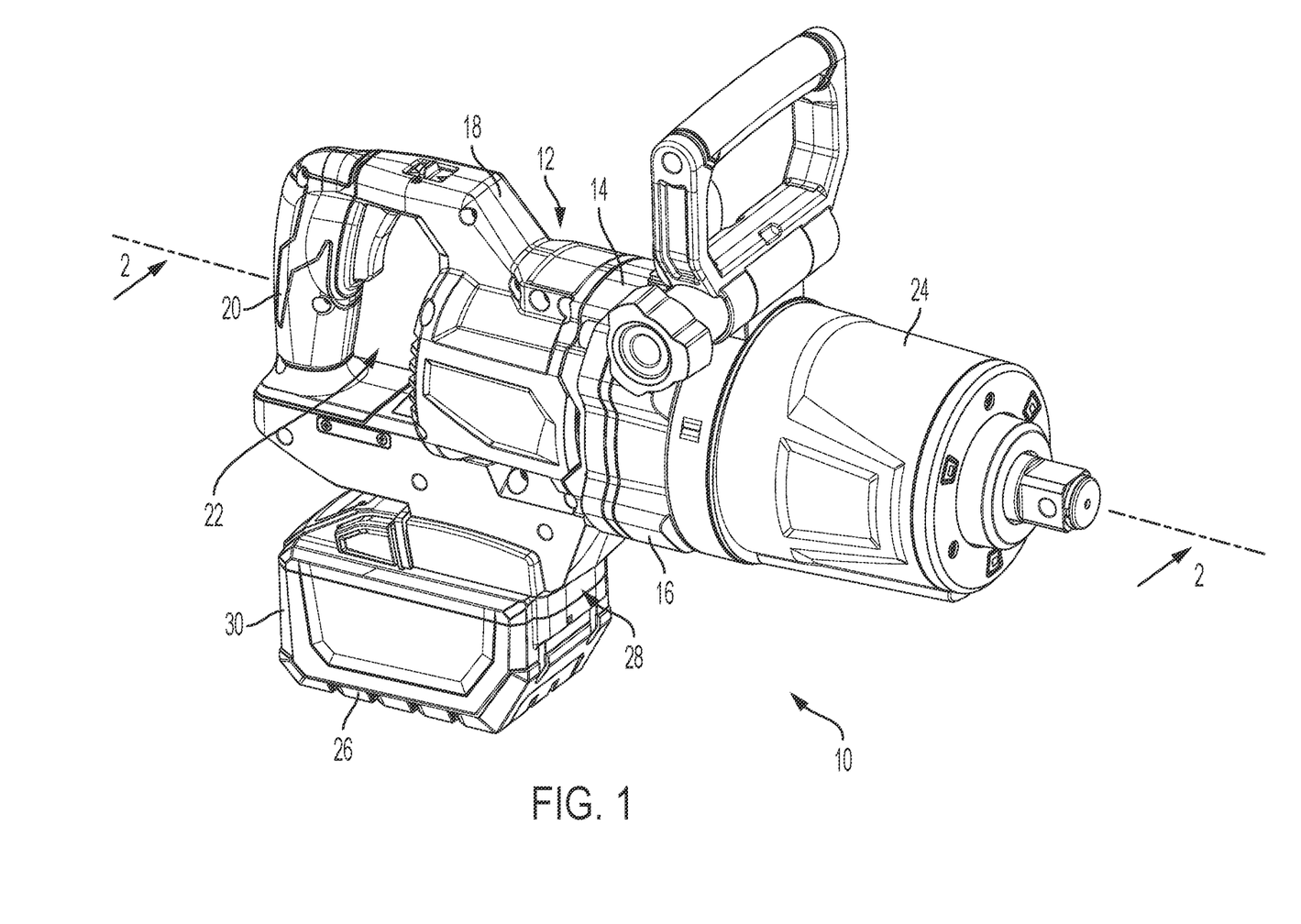
FIG. 1 is perspective view of an impact wrench according to one embodiment.

FIG. 1 illustrates a power tool in the form of an impact tool or impact wrench 10. The impact wrench 10 includes a housing 12 with a motor housing portion 14, a front housing portion 16 coupled to the motor housing portion 14 (e.g., by a plurality of fasteners), and a generally D-shaped handle portion 18 disposed rearward of the motor housing portion 14. The handle portion 18 includes a grip 20 that can be grasped by a user operating the impact wrench 10. The grip 20 is spaced from the motor housing portion 14 such that an aperture 22 is defined between the grip 20 and the motor housing portion 14. In the illustrated embodiment, the handle portion 18 is defined by cooperating clamshell halves, and the motor housing portion 14 and the front housing portion 16 are unitary bodies. A rubber boot or end cap 24 covers a front end of the front housing portion 16 to provide protection for the front housing portion 16. The rubber boot 24 may be permanently affixed to the front housing portion 16 or removable and replaceable.

With continued reference to FIG. 1, the impact wrench 10 is operable with a battery pack 26 removably coupled to a battery receptacle 28 located at a bottom end of the handle portion 18 (i.e. generally below the grip 20). The battery pack 26 includes a housing 30 enclosing a plurality of battery cells (not shown), which are electrically connected to provide the desired output (e.g., nominal voltage, current capacity, etc.) of the battery pack 26. In some embodiments, each battery cell has a nominal voltage between about 3 Volts (V) and about 5 V. The battery pack 26 preferably has a nominal capacity of at least 5 Amp-hours (Ah) (e.g., with two strings of five series-connected battery cells (a "5S2P" pack)). In some embodiments, the battery pack 26 has a nominal capacity of at least 9 Ah (e.g., with three strings of five series-connected battery cells (a "5S3P pack"). The illustrated battery pack 26 has a nominal output voltage of at least 18 V. The battery pack 26 is rechargeable, and the cells may have a Lithium-based chemistry (e.g., Lithium, Lithium-ion, etc.) or any other suitable chemistry.

Figure 2:
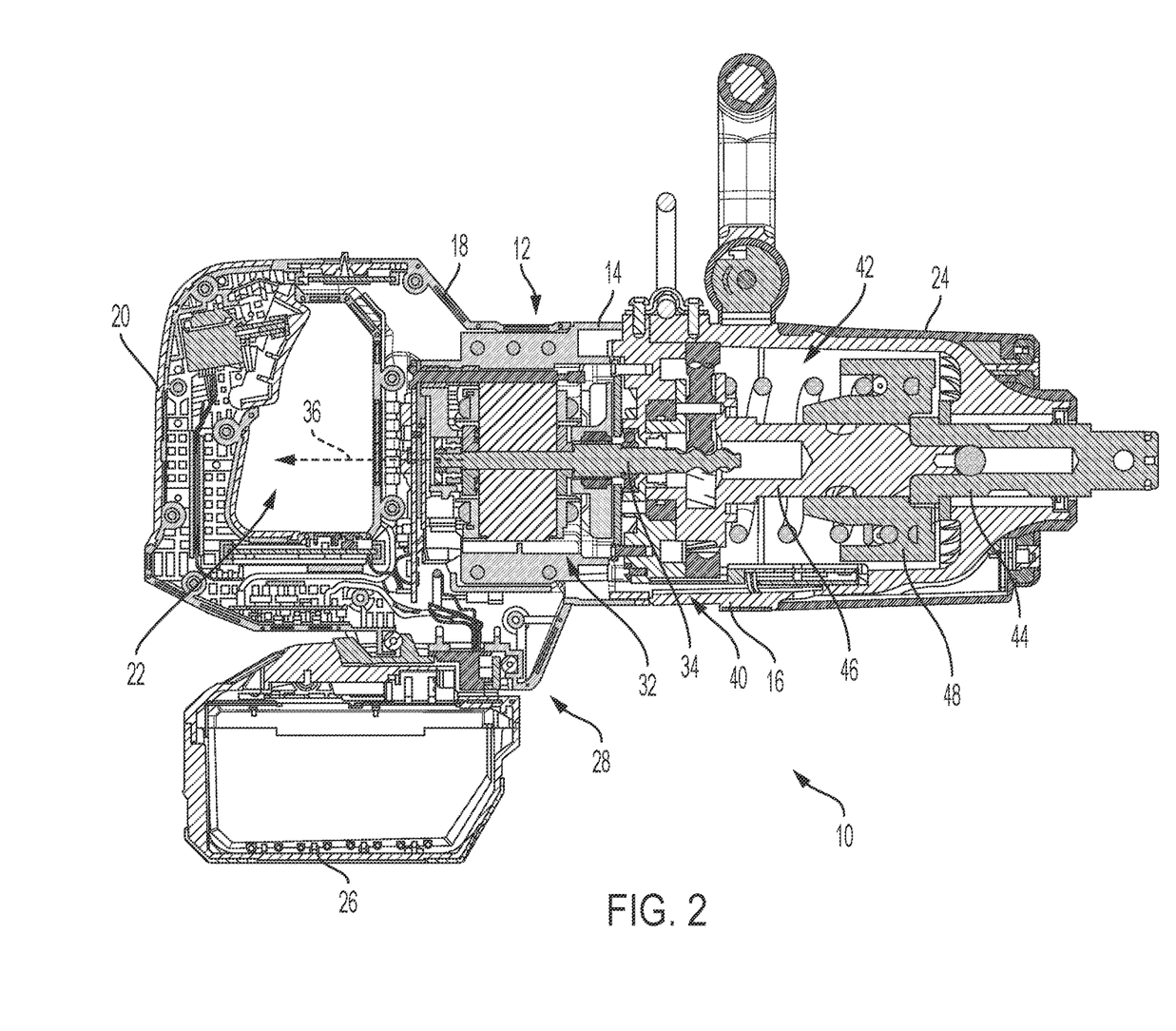
FIG. 2 is a cross-sectional view of the impact wrench of FIG. 1, taken along line 2-2 of FIG. 1.

Referring to FIG. 2, an electric motor 32, supported within the motor housing portion 14, receives power from the battery pack 26 when the battery pack 26 is coupled to the battery receptacle 28. The illustrated motor 32 is a brushless direct current ("BLDC") motor with a rotor or output shaft 34 that is rotatable about an axis 36. A fan 38 (FIG. 3) is coupled to the output shaft 34 (e.g., via a splined connection) adjacent a front end of the motor 32.

In some embodiments, the impact wrench 10 may include a power cord for electrically connecting the motor 32 to a source of AC power. The battery pack 26 is the preferred means for powering the impact wrench 10, however, because a cordless impact wrench can be used in locations where other power sources are unavailable.

With continued reference to FIG. 2, the impact wrench 10 further includes a gear assembly 40 coupled to the motor output shaft 34 and a drive assembly 42 coupled to an output of the gear assembly 40. The gear assembly 40 may be configured in any of a number of different ways to provide a speed reduction between the output shaft 34 and an input of the drive assembly 42.

The drive assembly 42 includes an anvil 44, extending from the front housing portion 16, to which a tool element (e.g., a socket; not shown) can be coupled for performing work on a workpiece (e.g., a fastener). The drive assembly 42 is configured to convert the continuous rotational force or torque provided by the motor 32 and gear assembly 40 to a striking rotational force or intermittent applications of torque to the anvil 44 when the reaction torque on the anvil 44 (e.g., due to engagement between the tool element and a fastener being worked upon) exceeds a certain threshold. In the illustrated embodiment of the impact wrench 10, the drive assembly 42 includes a camshaft 46, a hammer 48 supported on and axially slidable relative to the camshaft 46, and the anvil 44.

Figure 3:
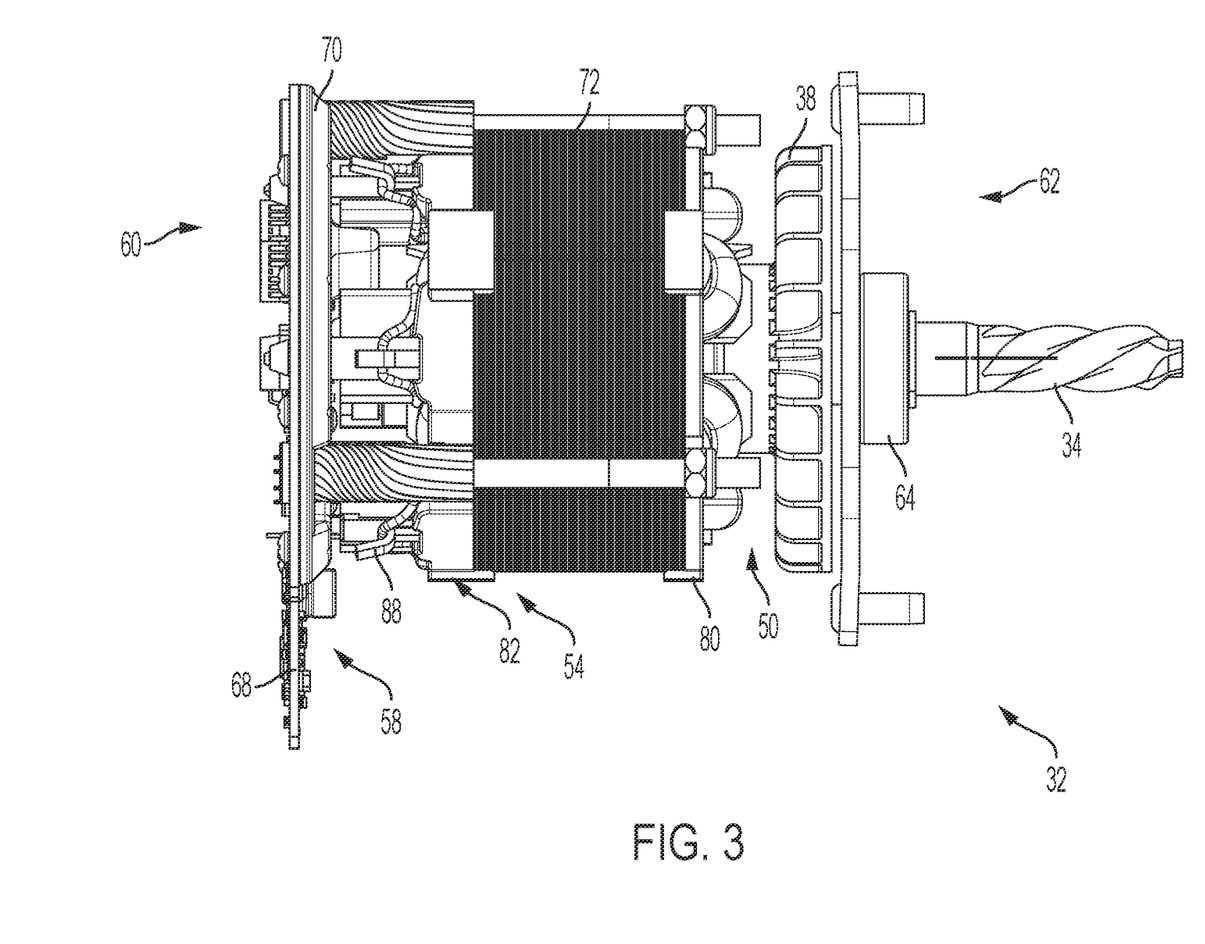
FIG. 3 is a side view of an electric motor operable with the impact wrench of FIG. 1.
Figure 4:
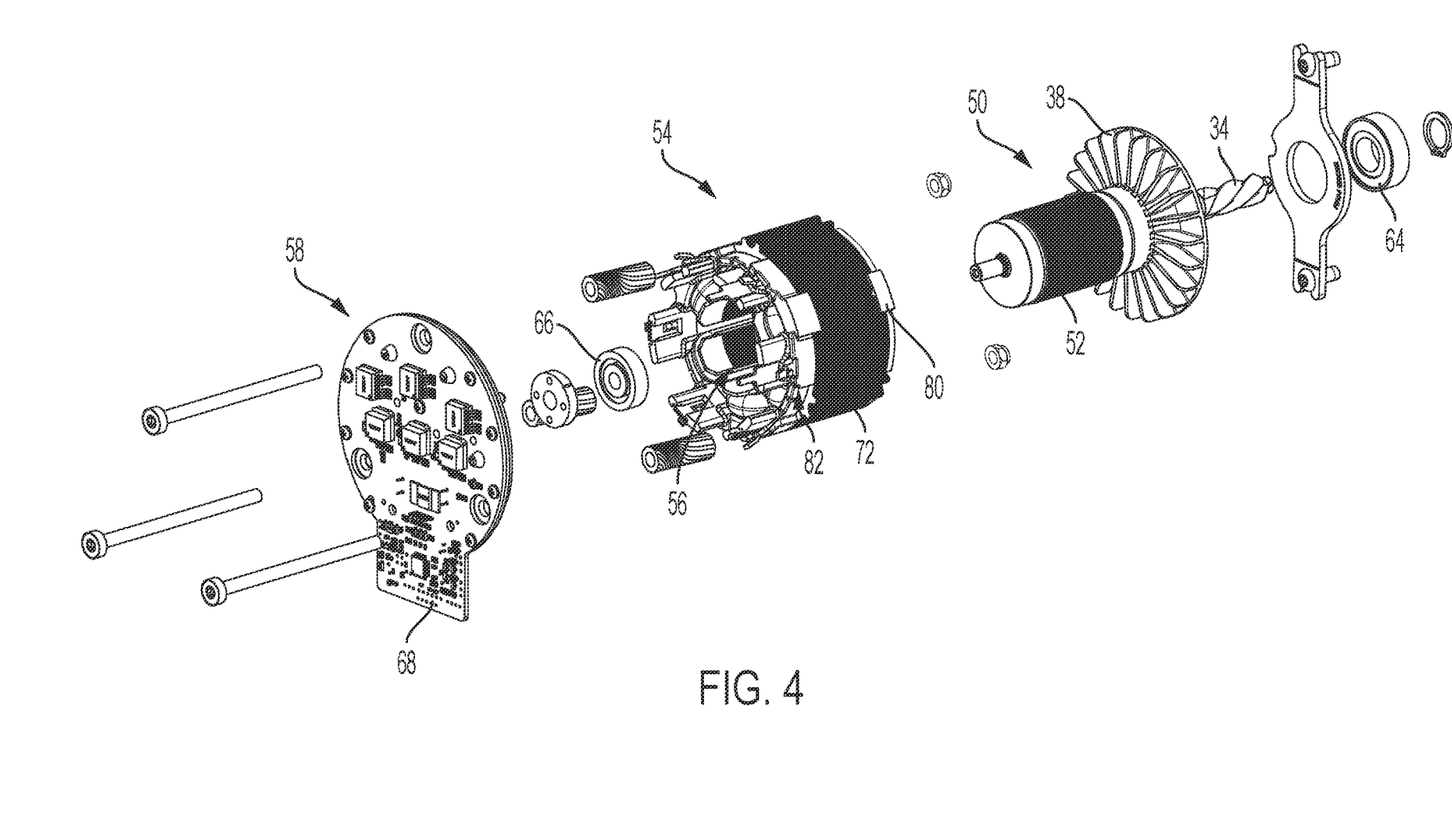
FIG. 4 is an exploded perspective view of the electric motor of FIG. 3.

With reference to FIGS. 3 and 4, the illustrated motor 32 includes a rotor assembly 50 having a rotor body 52 fixed to the output shaft 34 that couples to the gear assembly 40, and a stator assembly 54 having a central cavity 56 that receives the rotor assembly 50 to rotate about the axis 36. The output shaft 34 is rotatably supported by first and second bearings 64, 66. The motor 32 also includes a printed circuit board (PCB) assembly 58 coupled to a rear end 60 of the stator assembly 54 opposite a front end 62. The PCB assembly 58 includes a printed circuit board (PCB) 68 coupled to a heat sink 70, as will be discussed further below (FIGS. 6 and 7).

Figure 5:
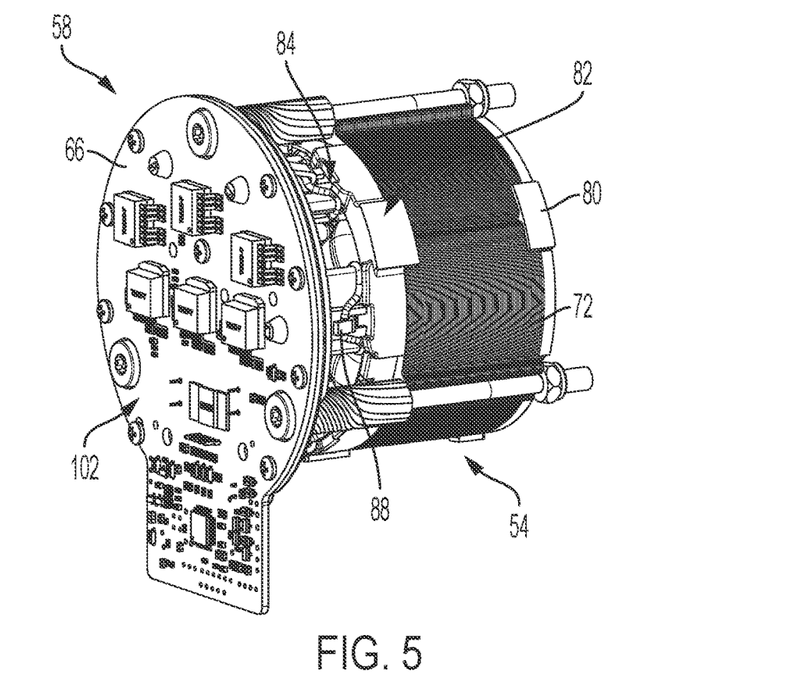
FIGS. 5 and 6 are perspective views illustrating a stator assembly and a printed circuit board (PCB) assembly of the electric motor of FIG. 3.
Figure 6:
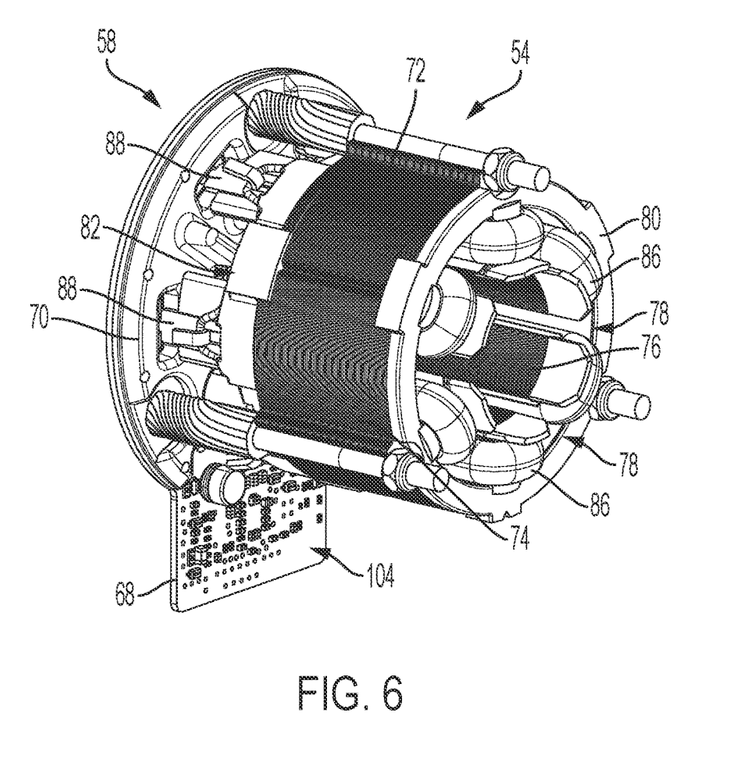

With reference to FIGS. 4-6, the stator assembly 54 includes a lamination stack 72 having an annular yoke 74 and six stator teeth 76 extending inwardly in a generally radial direction from the yoke 74. Stator slots 78 (FIG. 6) are defined between adjacent pairs of the teeth 76. The stator assembly 54 also includes a front end insulator or front bobbin 80 coupled to a front axial end face of the lamination stack 72, and a terminal block assembly 82 coupled to a rear axial end face of the lamination stack 72. The stator assembly 54 also includes windings 84 that are routed through the slots 78 and wound about the respective teeth 76 to form coils 86. The windings 84 are electrically connected to terminals 88 which, in turn, are electrically connected to the PCB 68 that selectively applies power to the windings 84, thereby causing the output shaft 34 to rotate about the axis 36 to operate the drive assembly 42.

Figure 7:
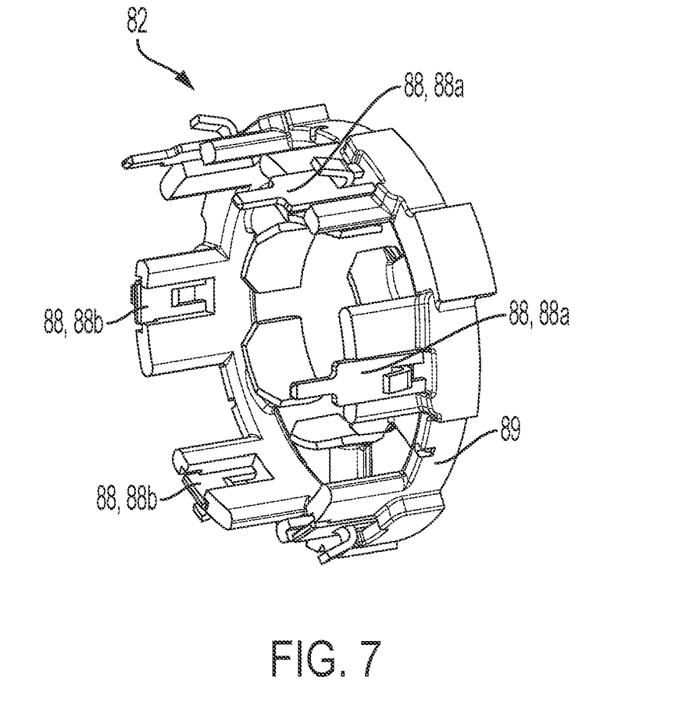
FIG. 7 is a perspective view illustrating a terminal block assembly of the stator assembly of FIG. 5.
Figure 8:
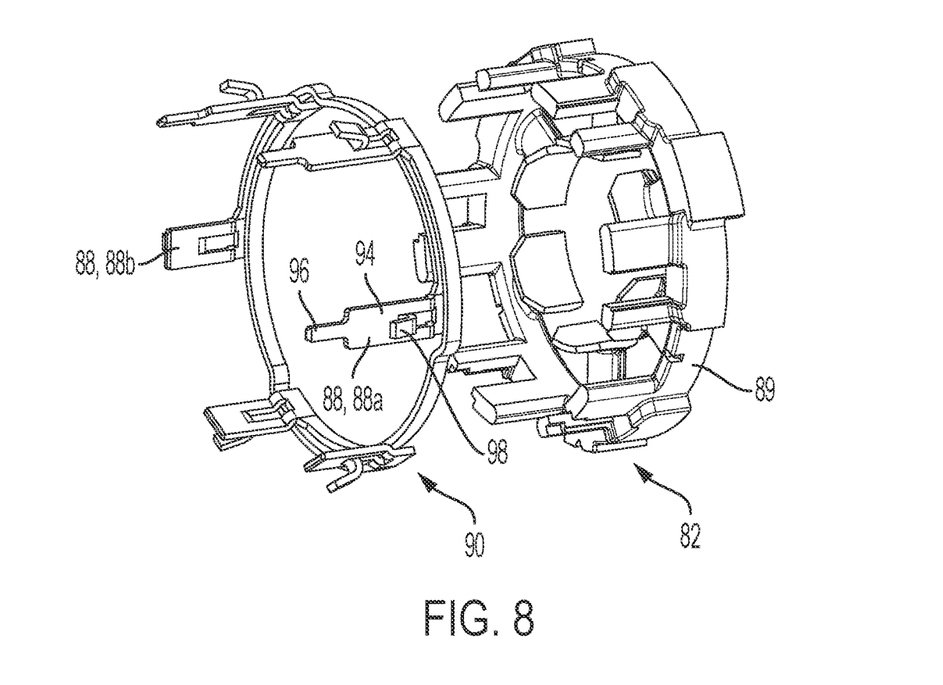
FIG. 8 is an exploded perspective view of the terminal block assembly of FIG. 7, illustrating a bus bar assembly.
Figure 9:
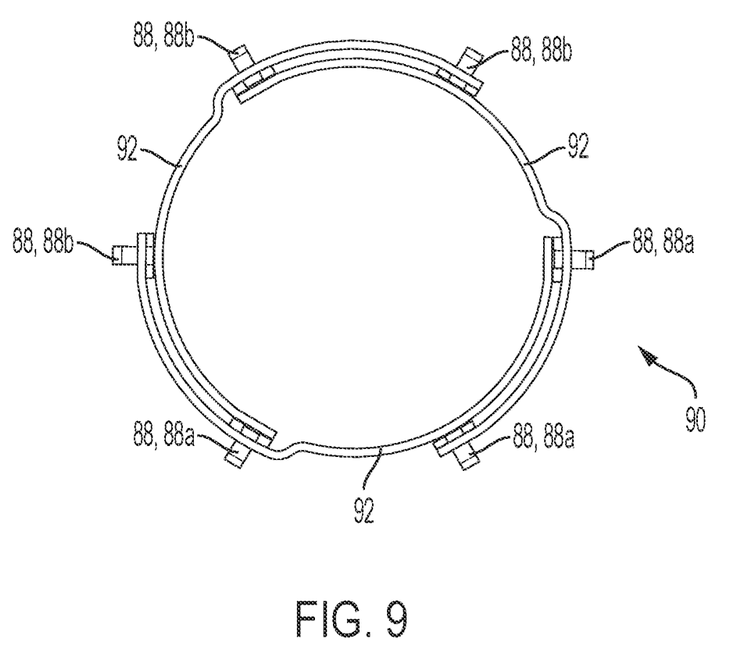
FIG. 9 is a plan view of the bus bar assembly of FIG. 8.

With reference to FIGS. 7-9, the terminal block assembly 82 includes a rear end insulator or rear bobbin 89 that supports a bus bar assembly 90 having three annular conductors 92 extending about a circumference of the rear bobbin 89. Each conductor 92 includes two terminals 88 including a primary terminal 88a and a secondary terminal 88b formed at opposite respective ends of the conductor 92. In the illustrated embodiment, each primary terminal 88a includes a central plate 94, a lead portion 96 extending from the central plate 94 and attached to the PCB 68, and a hook portion or tang 98 extending from the central plate 94 opposite the lead portion 96 and configured to engage the windings 84. Each secondary terminal 88b likewise includes the central plate 94 and the tang 98, but does not include a lead portion and does not attach to the PCB 68. The windings 84 wrap around each tang 98 to electrically connect to each respective terminal 88a or 88b.

Figure 10:
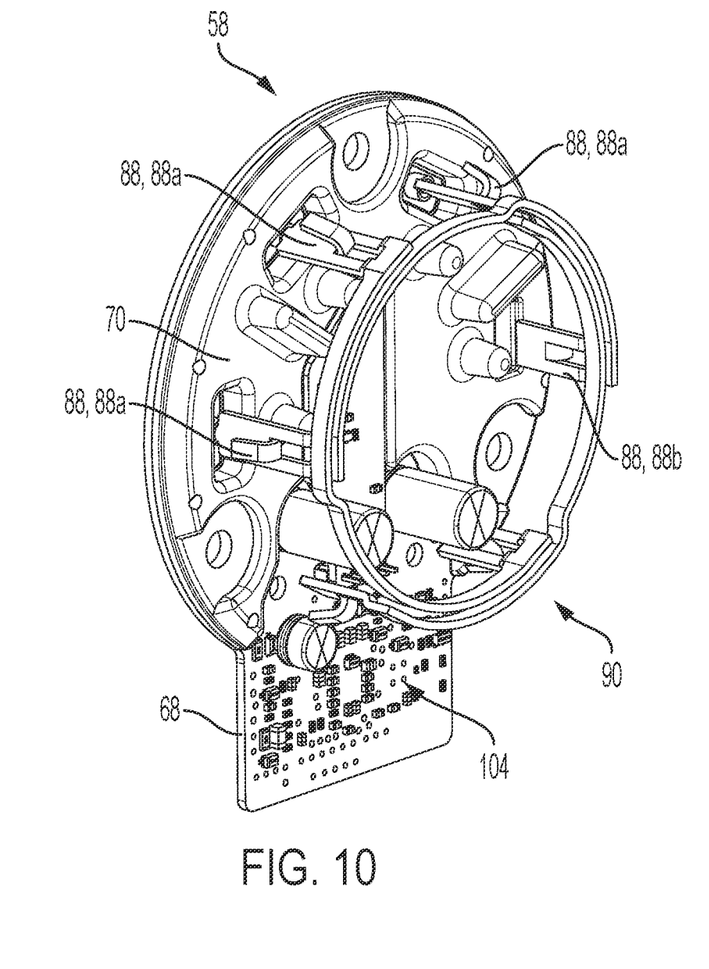
FIG. 10 is a perspective view of the PCB assembly of FIG. 5 and the bus bar assembly of FIG. 8.
Figure 11:
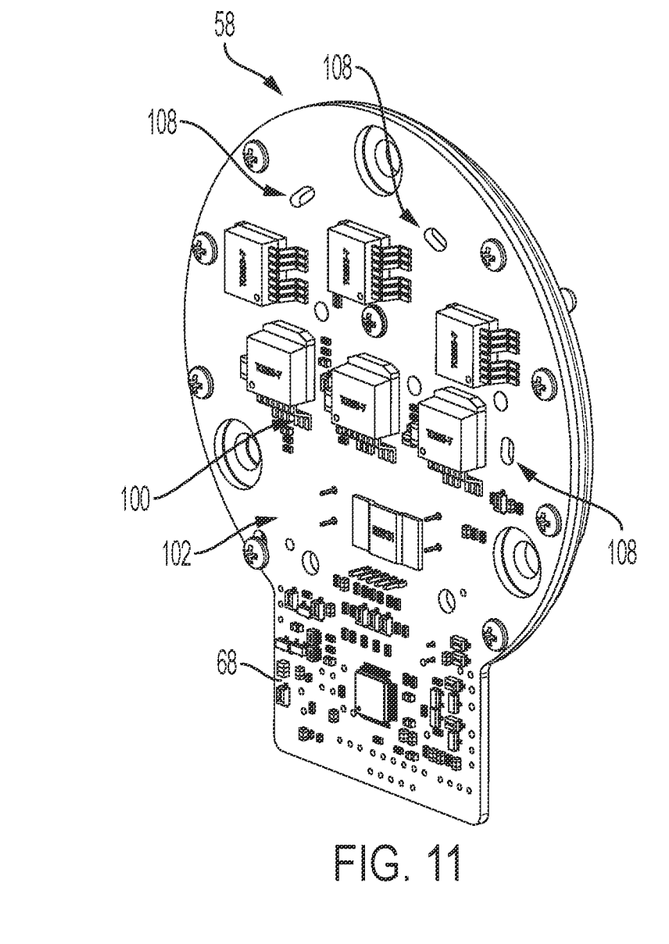
FIG. 11 is another perspective view of the PCB assembly of FIG. 5.
Figure 12:
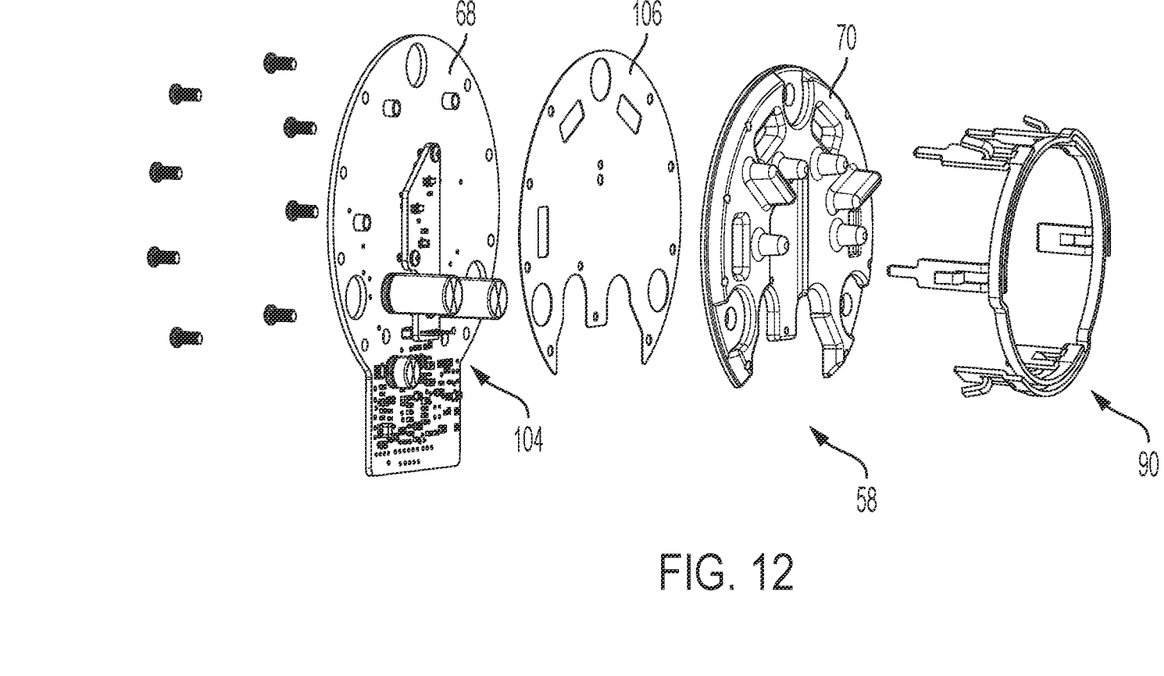
FIG. 12 is an exploded view illustrating the PCB assembly of FIG. 5 and the buss bar assembly of FIG. 8.

With reference to FIGS. 10-12, the PCB assembly 58 includes heat-generating components 100 (e.g., semiconductor FETs, current sense resistors, thermistors, capacitors, diodes, voltage sensors, etc.) supported on a first side 102 of the PCB 68 facing away from the stator assembly 54. A second side 104 of the PCB 68 faces toward the heat sink 70 and is in direct contact with a thermal pad 106 (e.g., a highly thermally conductive and electrically non-conductive member) positioned between the PCB 68 and the heat sink 70 to facilitate heat transfer from the heat-generating components 100 to the heat sink 70. In other embodiments, the thermal pad 106 can be omitted such that the PCB 68 directly contacts the heat sink 70.

Figure 13:
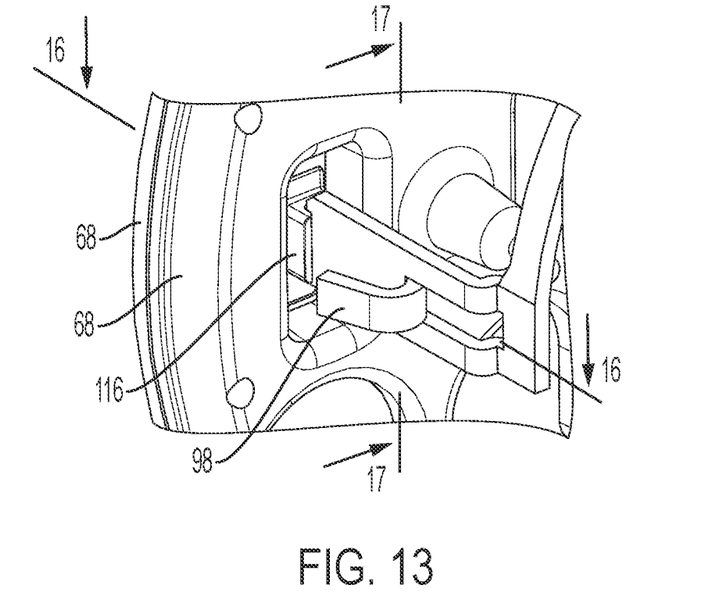
FIG. 13 is a detailed perspective view of portions of the PCB assembly of FIG. 5 and the bus bar assembly of FIG. 8.
Figure 14:
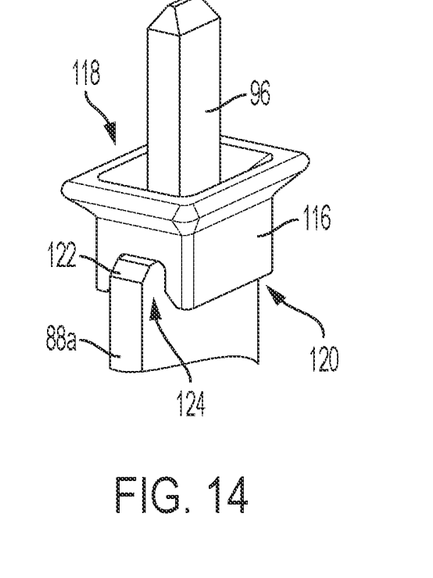
FIG. 14 a perspective view of a terminal of the bus bar assembly of FIG. 8.
Figure 16:
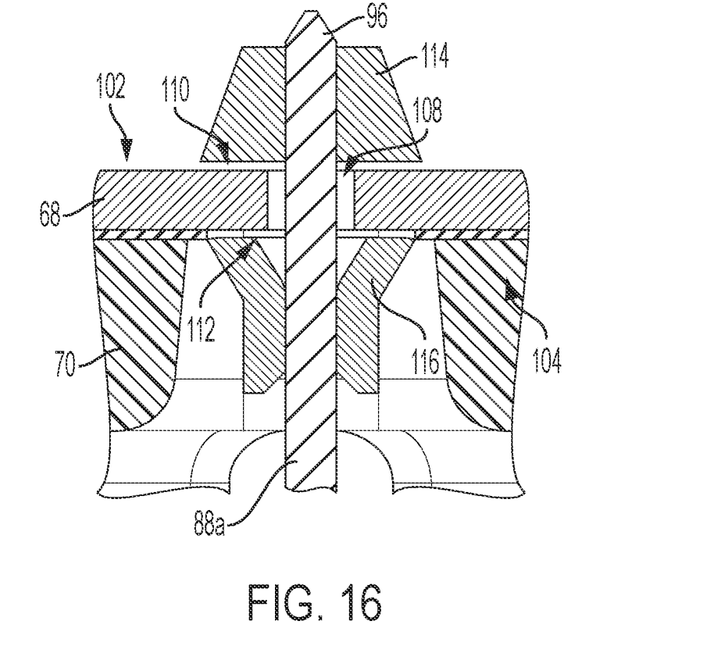
FIG. 16 is a cross-sectional view of the PCB assembly of FIG. 5, taken along line 16-16 of FIG. 13.
Figure 17:
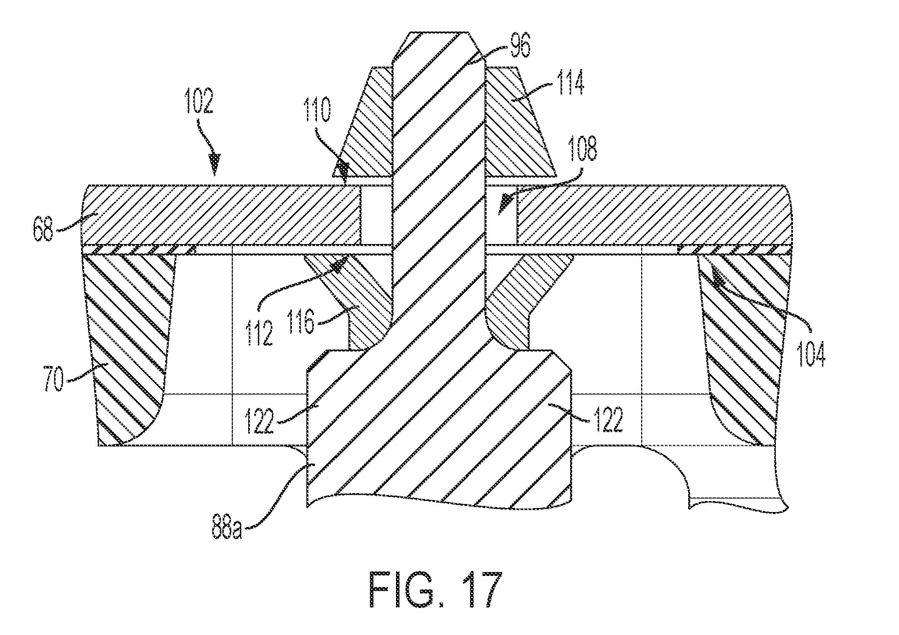
FIG. 17 is another cross-sectional view of the PCB assembly of FIG. 5, taken along line 17-17 of FIG. 13.

With reference to FIG. 11, the PCB 68 includes through holes 108 extending through the PCB 68 between the first and second sides 102, 104. The through holes 108 receive the lead portions 96 of the primary terminals 88a (FIG. 13). With reference to FIGS. 16-17, each through hole 108 is surrounded by a first solder pad 110 on the first side 102 of the PCB 68, and surrounded by a second solder pad 112 on the second side 104. The lead portions 96 of the primary terminals 88a are mechanically and electrically coupled to the PCB 68 by solder 114 that is applied to each lead portion 96 and to each first solder pad 110 at the first side 102, and permitted to flow through the respective through hole 108 toward the second solder pad 112 at the second side 104.

With reference to FIGS. 13-17, a solder sleeve or solder cup 116 is fitted onto the lead portion 96 adjacent the second side 104. The solder cup 116 prevents the solder 114 from undesirably wicking too far down the primary terminal 88a or dripping onto the heat sink 70, and also promotes a robust physical connection between the second solder pad 112 and the lead portion 96. In the illustrated embodiment, the solder cup 116 is funnel-shaped and defines a center aperture 117 that receives the lead portion 96 of the primary terminal 88a. The solder cup 116 includes a wide end 118 positioned adjacent the second solder pad 112, and a narrow end 120 that couples to the lead portion 96 of the primary terminal 88a (e.g., by compression or tight slip fit). Each primary terminal 88a includes a pair of shoulders 122 defined where the lead portion 96 joins the central plate 94 (FIG. 17), and the solder cup 116 includes a pair of cutouts 124 that receive the shoulders 122 to further secure the solder cup 116 to the primary terminal 88a.

The solder cup 116 restricts the flow of the solder 114 along the length of the primary terminal 88a to prevent unwanted spreading of the liquid solder 114 along the second side 104 of the PCB 68, which may otherwise cause a short-circuit on the PCB 68, by capturing the solder 114 at the wide end 118. Therefore, the liquid solder 114 is confined within the wide end 118 as it cools, promoting a strong physical connection with the second solder pad 112 and helping to ensure that the through hole 108 is sufficiently filled with the solder 114. Thus, the solder cup 116 promotes a strong physical connection between the primary terminals 88a and the PCB 68 that resists the formation of cracks (e.g., due to vibration generated during operation of the impact wrench 10).

Figure 15:
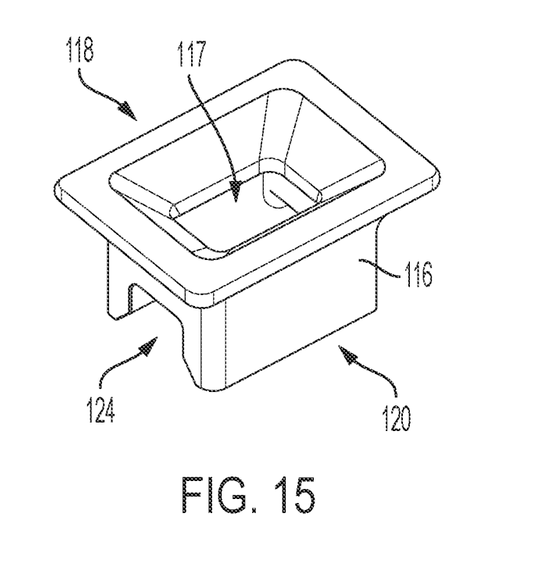
FIG. 15 is a perspective view of a solder cup of the bus bar assembly of FIG. 8.

In the illustrated embodiment, the solder cup 116 is made from silicone and can be transparent to permit inspection of the solder joint without removal. In other embodiments, the solder cup can be made from any other non-conductive material. In further embodiments (not shown), the solder cup can be omitted and the primary terminals can instead be provided with a widened or flared section having a shape similar to the wide end 118 of the solder cup 116, to likewise prevent the solder from wicking too far down the length of the primary terminal and ensure a good solder fillet at the second solder pad 112.

Various features of the disclosure are set forth in the following claims.

What is claimed is:

1. An electric motor comprising:
   a rotor assembly;
   a stator assembly including
      a lamination stack defining a plurality of inwardly extending teeth,
      a plurality of coils supported about the plurality of teeth, and
      a conductive terminal electrically connected to at least one coil of the plurality of coils, the conductive terminal including a lead portion;
   a printed circuit board coupled to the stator assembly and including opposed first and second sides, a through hole extending through the printed circuit board between the first and second sides and receiving the lead portion, and a solder pad surrounding the through hole on at least one of the first side or the second side; and
   a solder cup supported on the lead portion between the printed circuit board and the stator assembly, the solder cup having a wide end facing toward the printed circuit board, and a narrow end opposite the wide end.

2. The electric motor of claim 1, wherein the solder cup defines a center aperture extending between the wide end and the narrow end, the center aperture receiving the lead portion.

3. The electric motor of claim 1, wherein the solder pad comprises a first solder pad surrounding the through hole on the first side, and a second solder pad surrounding the through hole on the second side.

4. The electric motor of claim 1, wherein the conductive terminal further includes a plate portion and a shoulder defined between the plate portion and the lead portion, and wherein the solder cup defines a cutout that receives the shoulder.

5. The electric motor of claim 1, wherein the solder cup is formed from a transparent material.

6. The electric motor of claim 1, wherein the conductive terminal further includes a tang portion configured to engage the at least one coil.

7. The electric motor of claim 1, further including a heat-generating component supported on the first side of the printed circuit board and a heat sink coupled to the printed circuit board at the second side, and wherein the wide end of the solder cup faces toward the second side.

8. The electric motor of claim 7, further comprising a thermal pad disposed between the printed circuit board and the heat sink.

9. The electric motor of claim 1, further comprising
   an insulator bobbin coupled to an axial end of the lamination stack, and
   an annular conductor extending about at least a portion of a circumference of the insulator bobbin, wherein the annular conductor defines the conductive terminal.

10. A power tool comprising:
    a housing;
    an electric motor including
       a rotor assembly,
       a stator assembly having a plurality of inwardly extending teeth, a plurality of coils supported about the teeth, and a conductive terminal electrically coupled to at least one coil of the plurality of coils, the conductive terminal including a lead portion, and
       a printed circuit board coupled to the stator assembly, the printed circuit board including a through hole configured to receive the lead portion, and
       a solder cup supported on the lead portion, the solder cup having a funnel shape and including a wide end facing toward the printed circuit board and configured to capture solder applied to the lead portion.

11. The power tool of claim 10, wherein the printed circuit board includes
    opposed first and second sides, and
    a solder pad that surrounds the through hole on at least one of the first side or the second side.

12. The power tool of claim 11, wherein the solder pad comprises
    a first solder pad surrounding the through hole on the first side, and
    a second solder pad surrounding the through hole on the second side.

13. The power tool of claim 10, wherein the solder cup includes a narrow end opposite the wide end and a center aperture extending between the wide end and the narrow end, the center aperture receiving the lead portion.

14. The power tool of claim 10, wherein the conductive terminal further includes a plate portion and a shoulder defined between the plate portion and the lead portion, and wherein the solder cup defines a cutout that receives the shoulder.

15. The power tool of claim 10, wherein the solder cup is formed from a transparent material.

16. The electric motor of claim 10, wherein the conductive terminal further includes a tang portion configured to engage the at least one coil.

17. The power tool of claim 10, further comprising a heat-generating component supported on the first side of the printed circuit board and a heat sink coupled to the printed circuit board at the second side, and wherein the wide end of the solder cup faces toward the second side.

18. The power tool of claim 17, further comprising a thermal pad disposed between the printed circuit board and the heat sink.

19. The power tool of claim 10, wherein the stator assembly includes an insulator bobbin and an annular conductor extending about at least a portion of a circumference of the insulator bobbin, wherein the annular conductor defines the conductive terminal.

20. A printed circuit board assembly soldered to a lead portion of a conductive terminal of an electric motor, the printed circuit board assembly comprising:
   a printed circuit board including opposed first and second sides, a through hole extending through the printed circuit board between the first and second sides and receiving the lead portion, a first solder pad surrounding the through hole on the first side, and a second solder pad surrounding the through hole on the second side; and
   a solder cup supported on the lead portion, the solder cup having a funnel shape and including a wide end facing toward the printed circuit board, a narrow end opposite the wide end, and a center aperture extending between the wide end and the narrow end, the center aperture configured to receive the lead portion.

* * * * *